(12) United States Patent
Lu et al.

(10) Patent No.: US 10,971,498 B2
(45) Date of Patent: Apr. 6, 2021

(54) METHOD OF FORMING A SEMICONDUCTOR MEMORY DEVICE WITH A LATERALLY ETCHED BOTTOM DIELECTRIC LAYER

(71) Applicants: UNITED MICROELECTRONICS CORP., Hsin-Chu (TW); Fujian Jinhua Integrated Circuit Co., Ltd., Quanzhou (CN)

(72) Inventors: Chien-Ming Lu, Kaohsiung (TW); Fu-Che Lee, Taichung (TW); Feng-Yi Chang, Tainan (TW)

(73) Assignees: UNITED MICROELECTRONICS CORP., Hsin-Chu (TW); Fujian Jinhua Integrated Circuit Co., Ltd., Quanzhou ( * ) Notice: Subject to any disclaimer, the term of this patent is extended or adjusted under 35 U.S.C. 154(b) by 0 days.

(21) Appl. No.: 16/137,513

(22) Filed: Sep. 20, 2018

(65) Prior Publication Data
US 2020/0066728 A1 Feb. 27, 2020

(30) Foreign Application Priority Data

Aug. 23, 2018 (CN) .......................... 201810968333.1

(51) Int. Cl.
*H01L 27/108* (2006.01)
(52) U.S. Cl.
CPC .. *H01L 27/10823* (2013.01); *H01L 27/10855* (2013.01); *H01L 27/10876* (2013.01); *H01L 27/10885* (2013.01); *H01L 27/10888* (2013.01)

(58) Field of Classification Search
CPC ......... H01L 27/10823; H01L 27/10876; H01L 27/10882–10891; H01L 27/10805–10841; H01L 27/10847–10891; H01L 27/10888; H01L 27/10885; H01L 27/10855; H01L 21/76802; H01L 21/76897; H01L 21/823468
See application file for complete search history.

(56) References Cited

U.S. PATENT DOCUMENTS

| 9,356,073 | B1 * | 5/2016 | Kim ................. H01L 21/76805 |
| 2014/0159194 | A1 * | 6/2014 | Song ................. H01L 27/10855 257/522 |
| 2015/0162335 | A1 * | 6/2015 | Kim ................. H01L 27/10876 257/773 |

(Continued)

*Primary Examiner* — Younes Boulghassoul
(74) *Attorney, Agent, or Firm* — Winston Hsu

(57) ABSTRACT

A semiconductor memory device and a method of forming the same, the semiconductor memory device includes a substrate, a dielectric layer, plural bit lines, at least one bit line contact, a spacer structure and a spacer layer. The substrate has an isolation area to define plural active areas. The dielectric layer is disposed on the substrate, and the dielectric layer includes a bottom layer having a sidewall being retracted from sidewalls of other layers of the dielectric layer. The plural bit lines are disposed on the dielectric stacked structure, along a direction, and the at least one bit line contact is disposed below one of the bit lines, within the substrate. The spacer structure is disposed at sidewalls of each of the bit lines, and the spacer layer is disposed on the spacer structure to directly in contact with the spacer structure and the other layers of the dielectric layer.

9 Claims, 6 Drawing Sheets

(56) References Cited

U.S. PATENT DOCUMENTS

| | | | |
|---|---|---|---|
| 2016/0027727 A1* | 1/2016 | Kim | H01L 21/764 257/774 |
| 2016/0181143 A1* | 6/2016 | Kwon | H01L 27/10855 438/586 |
| 2017/0125283 A1* | 5/2017 | Lee | H01L 27/10814 |
| 2018/0012894 A1* | 1/2018 | Kim | H01L 27/10814 |
| 2018/0166450 A1* | 6/2018 | Kim | H01L 27/10885 |
| 2018/0226410 A1* | 8/2018 | Chang | H01L 27/10897 |
| 2019/0067294 A1* | 2/2019 | Lee | H01L 27/10885 |
| 2019/0096890 A1* | 3/2019 | Lee | H01L 27/10855 |
| 2019/0206872 A1* | 7/2019 | Kim | H01L 27/10814 |
| 2020/0035541 A1* | 1/2020 | Chun | H01L 27/10855 |

* cited by examiner

METHOD OF FORMING A SEMICONDUCTOR MEMORY DEVICE WITH A LATERALLY ETCHED BOTTOM DIELECTRIC LAYER

BACKGROUND OF THE INVENTION

1. Field of the Invention

The present invention generally relates to the field of semiconductor memory devices and forming method thereof, and more particularly to a dynamic random access memory (DRAM) device and a forming method thereof.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. For example, the reduced line-width also increases the line resistance (R). Furthermore, the shrunk spaces between wires also increase the parasitic capacitance (C), so that, the RC delay is therefore increase to achieve poor efficiency. Therefore, there is still a need to provide an improved memory cell with a buried gate to gain enhanced performance and reliability of the corresponding memory device.

SUMMARY OF THE INVENTION

One object of the present invention is to provide a method of forming a semiconductor memory device, in which, a multilayer structure of a dielectric layer disposed below bit lines are patterned respectively during different processes, so that, only a bottom layer of the multilayer structure of the dielectric layer has a retracted sidewall, for exposing more portion of the substrate. That is, the method of the present invention enables to form preferably plug for providing better connection with the substrate, and to obtain a better semiconductor memory device thereby, for improving the electrical connection between the storage node and the transistor underneath.

One object of the present invention is to provide a semiconductor memory device, in which, only a bottom layer of a dielectric layer disposed below the bit lines has a retracted sidewall, for exposing more portion of the substrate. That is, the semiconductor memory device of the present application may obtain more contact area between the substrate and plugs formed subsequently, so as to gain a better structure for improving the electrical connection between the storage node and the transistor underneath.

To achieve the purpose described above, the present invention provides a method of forming a semiconductor memory device including the following steps. First of all, a substrate is provided, and the substrate includes an isolation area to define a plurality active areas therein. Next, a dielectric layer is formed on the substrate with a bottom portion of the dielectric layer being laterally etched. Then, a plurality of bit lines is formed on the dielectric layer along a direction, and at least one bit line contact is formed in the substrate, below one of the bit lines. Finally, a spacer structure is formed on sidewalls of each of the bit lines, and a spacer layer is formed on sidewalls of the spacer structure, with the spacer layer directly in contact with the spacer structure and sidewalls of other portion of the dielectric layer.

To achieve the purpose described above, the present invention provides a semiconductor memory device including a substrate, a dielectric layer, a plurality of bit lines, a bit line contact, a spacer structure and a spacer layer. The substrate includes a plurality of isolation area to define a plurality active areas therein. The dielectric layer is disposed on the substrate, wherein the dielectric layer has a multilayer structure and the multilayer structure includes a bottom layer with a retracted sidewall. The bit lines are disposed on the dielectric layer along a direction, and at least one bit line contact is disposed in the substrate, below one of the bit lines. The spacer structure is disposed on sidewalls of each of the bit lines, and the spacer layer is disposed on the spacer structure, with the spacer layer directly in contact with the spacer structure and other layers of the multilayer structure of the dielectric layer.

In summary, the method of the present invention utilizes the forming process of the spacer structure to simultaneously pattern a portion of the dielectric material layer, to make partial layers of the multilayer structure of the dielectric material layer being vertical aligned with the sidewall of the spacer structure, followed by further patterned the rest bottom layer of the multilayer structure of the dielectric material layer while defining the plug trenches in the subsequent process. In this way, the dielectric layer formed thereby may obtain misaligned sidewalls in each layer, and only the oxide layer disposed at the bottom of the multilayer structure will be laterally etched to have a retracted sidewall without directly in contact with the spacer layer. That is, the semiconductor memory device obtained in the present invention may sufficiently increase the expose portion of the substrate without further affecting the depth or the shape of the plug trenches, and then, the plugs formed in those plug trenches may therefore obtain more contact areas with the substrate, so as to avoid the disconnection between the storage node contact and the transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic diagrams illustrating a method of forming a semiconductor memory device according to a first preferred embodiment of the present invention, in which:

FIG. 1 shows a top view of a semiconductor memory device at the beginning of the forming process;

FIG. 2 shows a cross-sectional view taken along a cross-line A-A' in FIG. 1;

FIG. 3 shows a cross-sectional view of a semiconductor memory device after performing an etching process; and FIG. 4 shows a cross-sectional view of a semiconductor memory device after forming a plug.

FIG. 5 to FIG. 10 are schematic diagrams illustrating a method of forming a semiconductor memory device according to a second preferred embodiment of the present invention, in which:

FIG. 5 shows a cross-sectional view of a semiconductor memory device after forming a material layer;

FIG. 6 shows a cross-sectional view of a semiconductor memory device after forming a spacer structure;

FIG. 7 shows a cross-sectional view of a semiconductor memory device after forming a another material layer;

FIG. 8 shows a cross-sectional view of a semiconductor memory device after performing an etching process;

FIG. 9 shows a cross-sectional view of a semiconductor memory device after performing another etching process; and FIG. 10 shows a cross-sectional view of a semiconductor memory device after forming a plug.

DETAILED DESCRIPTION

To provide a better understanding of the present invention, preferred embodiments will be described in detail. The preferred embodiments of the present invention are illustrated in the accompanying drawings with numbered elements.

Figure 1:
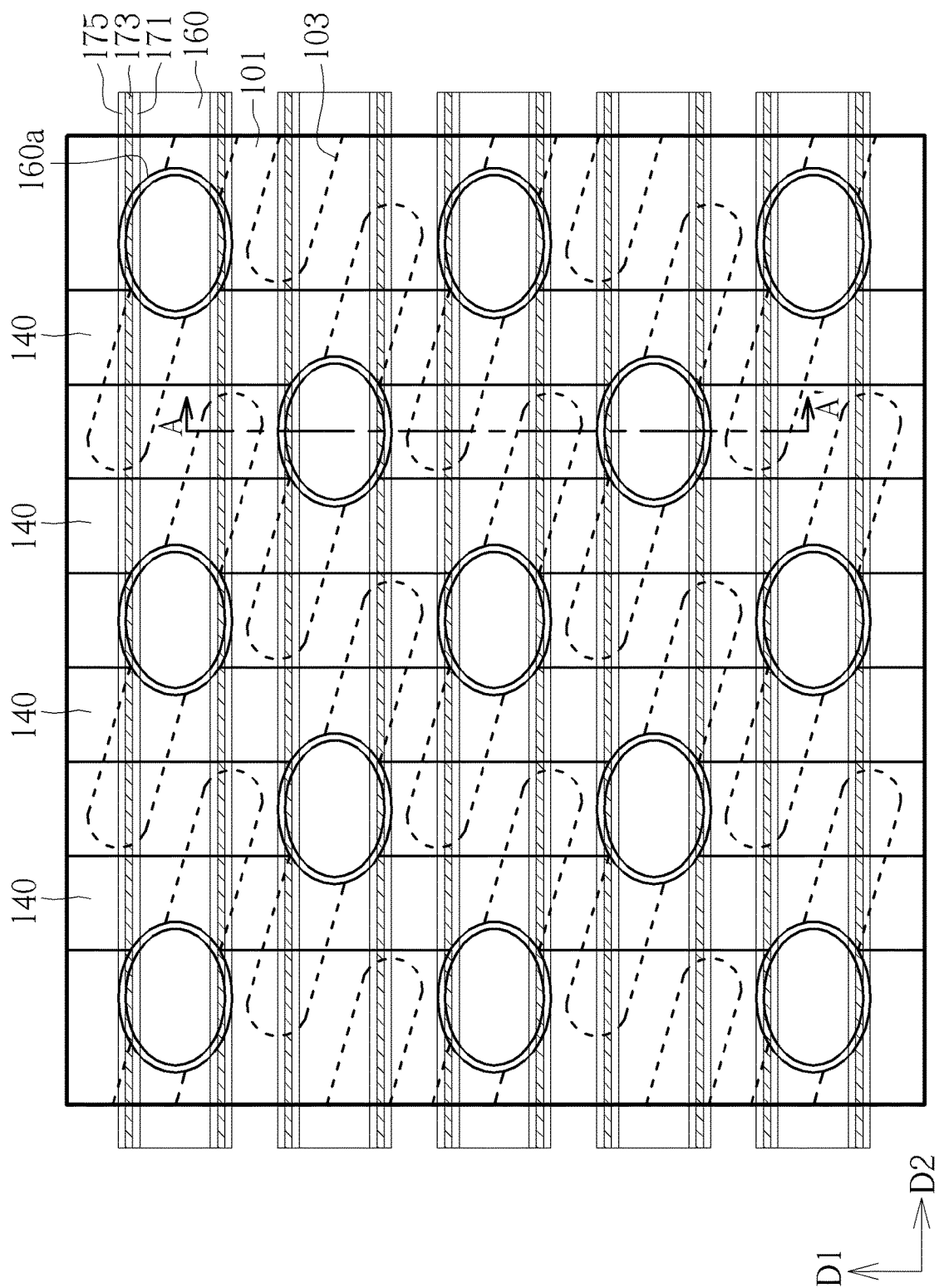
Figure 2:
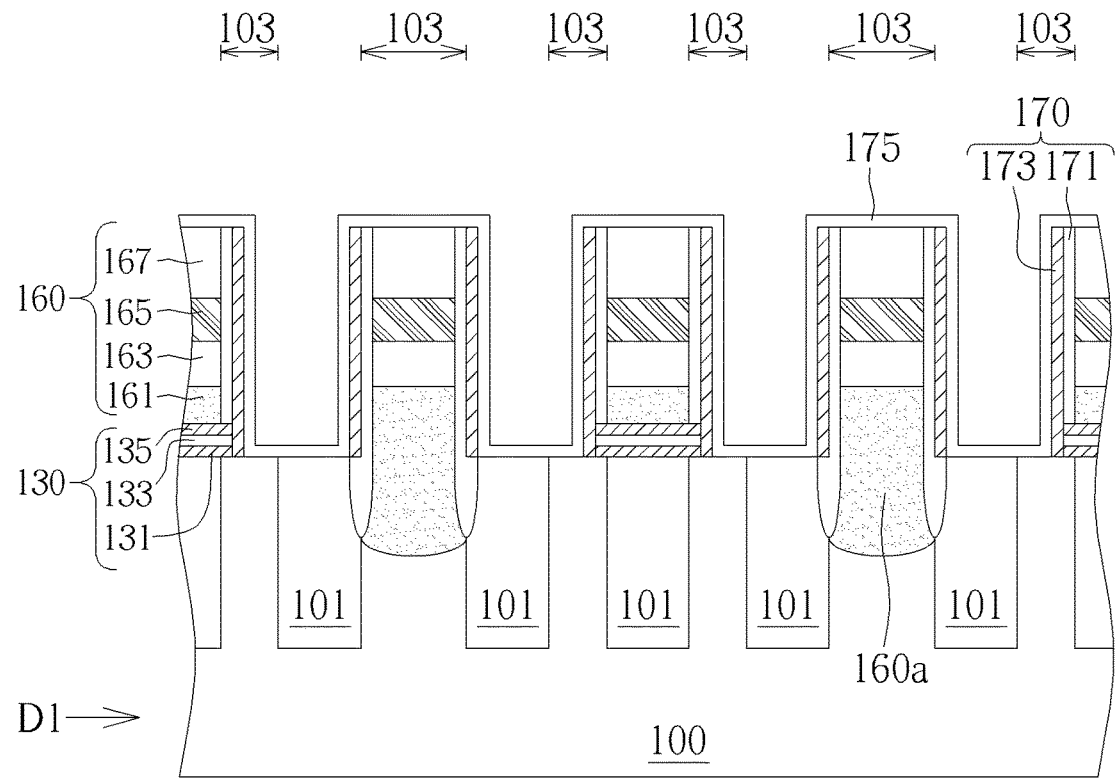
Figure 3:
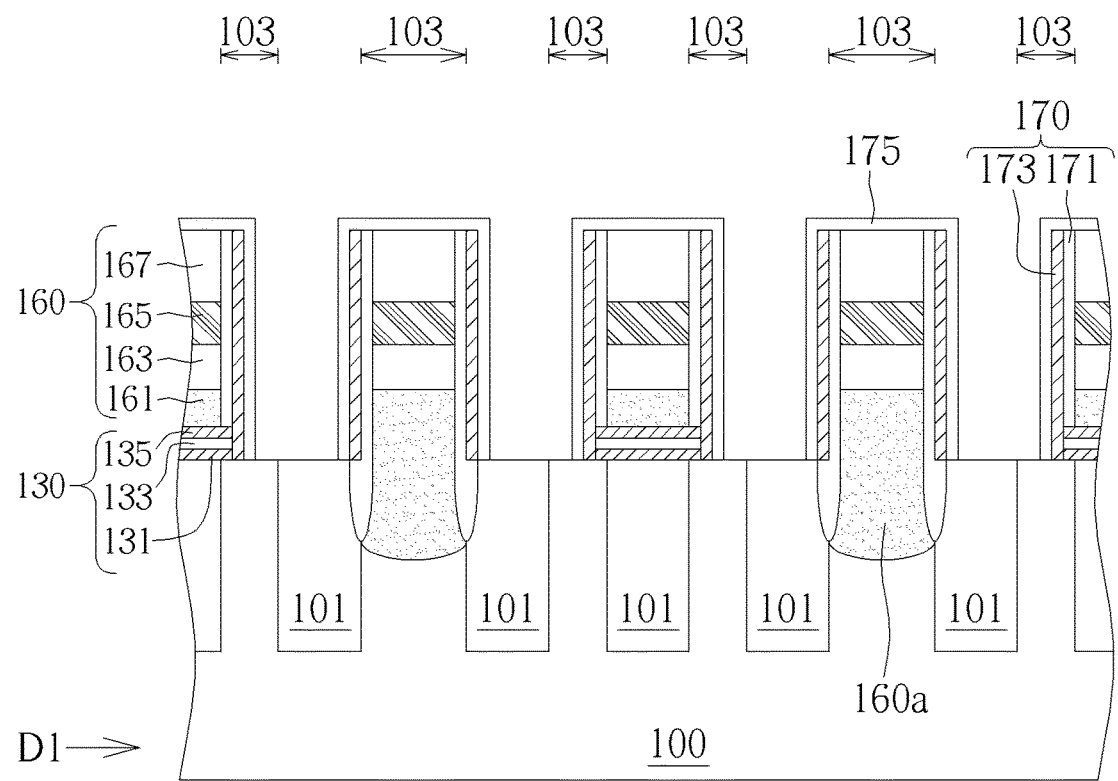
Figure 4:
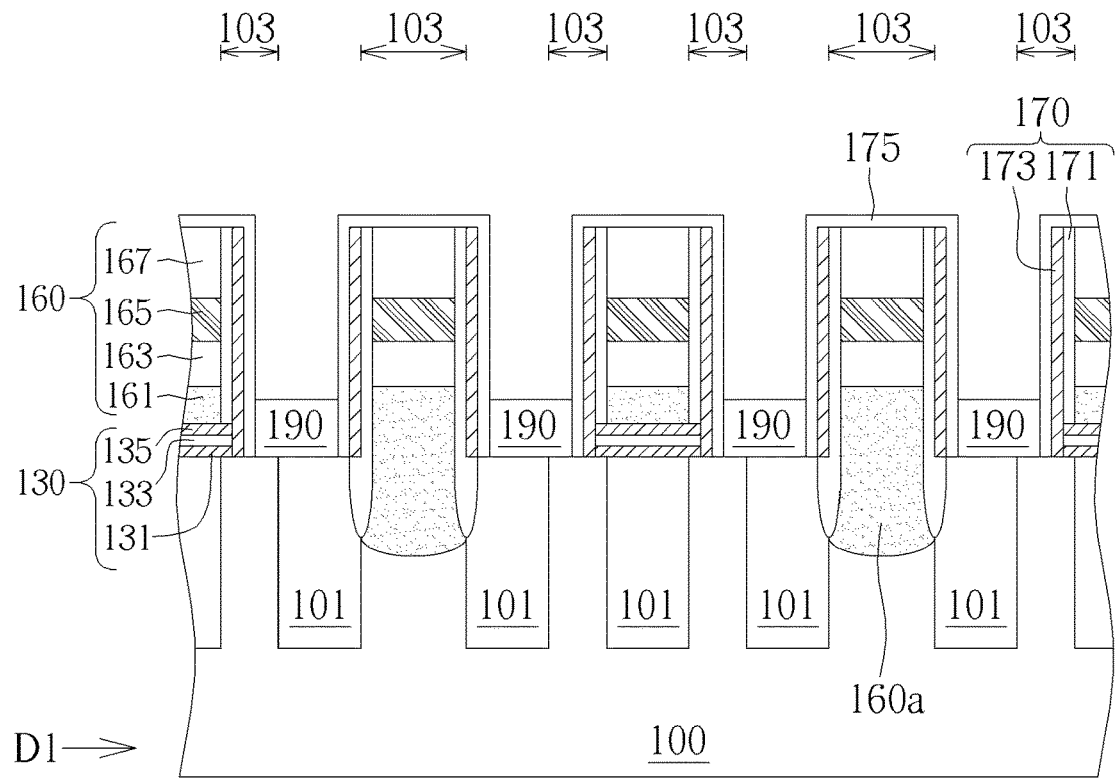

Referring to FIGS. 1-4, FIGS. 1-4 illustrate a forming method of semiconductor device according to the first preferred embodiment of the present invention, in which, FIG. 1 shows a top view of a semiconductor memory device during the forming method, and FIGS. 2-4 show a cross-sectional views of a semiconductor memory device during the forming method respectively. The semiconductor memory device of the present embodiment is for example a dynamic random access memory (DRAM) device which at least includes at least one transistor structure (not shown in the drawings) and at least one capacitor structure (not shown in the drawings), thereto serve as the smallest unit in the DRAM array for accepting signals from bit lines 160 and word lines 140 during the operation.

The semiconductor memory device includes a substrate 100, such as a silicon substrate, a silicon containing substrate like SiC or SiGe, or a silicon on insulator (SOI) substrate, and at least one isolated area 101 such as a shallow trench isolation (STI) is formed in the substrate to define a plurality of active areas (AA) 103 therein. The formation of the isolated area 101 is but not limited to be accomplished by performing an etching process to form a plurality of trenches (not shown in the drawings) in the substrate 100, followed by forming an insulating material such as silicon oxide (SiO) or silicon oxynitride (SiON) in the trenches.

As shown in FIG. 1, a plurality of buried gates (not shown in the drawings) is formed in the substrate 100, and the buried gates are parallel extended along a direction D1 to cross the AAs 103, thereby forming the buried word lines (BWLs) 140 of the semiconductor memory device. Also, a plurality of source/drain regions (not shown in the drawings) may further be formed in the substrate 100 at two sides of each of the buried gates, and then, the buried gates and the source/drain regions may together form the transistor structures of the semiconductor memory device. Additionally, a plurality of bit lines 160 is formed on the substrate 100, and which are parallel extended along a direction D2 which is perpendicular to the BWLs 140, to simultaneously cross the AAs 103 and BWLs 140 in the substrate 100. The bit lines 160 are formed on a dielectric layer 130 disposed on the substrate 100, with each of the bit lines 160 for example including a semiconductor layer 161, a barrier layer 163, a metal layer 165 and a mask layer 167 stacked one over another on the substrate 100. Then, a portion of the bit lines 160 further includes a bit line contact (BLC) 160a disposed underneath, and the bit line contacts 160a and the semiconductor layer 161 of the bit lines 160 may be monolithic as shown in FIG. 2. In the present embodiment, the dielectric layer 130 preferably includes a multilayer structure, for example including an oxide layer 131-nitride layer 133-oxide layer 135 (ONO) structure, but is not limited thereto.

Next, a spacer structure 170 and a spacer layer 175 are formed to surround each of the bit lines 160. The spacer structure 170 includes a composite structure including a spacer 171 and a spacer 173. In the present embodiment, the two spacers 171, 173 disposed at two sides of each of the bit lines 160 are formed through different deposition and etching processes, so that, both of the two spacers 171, 173 have a stripe shape in a cross-sectional view along the direction D1, and different materials, as shown in FIG. 2. Precisely speaking, the formation of the spacer 171 is firstly carried out by entirely depositing a silicon nitride material layer on the bit lines 160 and the substrate 100 to cover each of the bit lines 160 and the bit line contacts 160a, followed by performing an etching back process to form the spacer 171 including silicon nitride, and then, the formation of the spacer 173 is carried out by entirely depositing a silicon oxide material layer, followed by performing another etching back process to form the spacer 173 including silicon oxide, but not limited thereto. It is noted that, after performing the etching back process of the spacer 171, a dielectric material (not shown in the drawings) disposed underneath may also be optionally patterned to form the dielectric layer 130. The dielectric material layer is formed on the substrate 100 right after the BWLs 140 have been formed in the substrate 100, to completely cover the isolation area 101 and the AAs 103. Then, a portion of the dielectric material layer and the substrate 100 underneath is firstly removed while defining openings of the bit line contacts 160a through a first patterning process of the dielectric material layer, and the dielectric material layer is further removed while forming the spacer 171 via a further patterning process of the dielectric material layer, thereby forming the dielectric layer 130.

Through these performances, the bit lines 160 and the spacer 171 disposed at two sides thereof are both formed on the dielectric layer 130, and the spacer 173 is formed on the isolation area 101 or the AAs 103 of the substrate 100, as shown in FIG. 2. However, in other embodiment, the further patterning process of the dielectric material layer may also be performed while forming the bit lines 160 or performing the etching back process of the spacer 173, so that, the dielectric layer and the spacer structure formed thereby may obtain different profiles. On the other hand, the spacer layer 175 formed subsequently entirely covers the substrate 100, the bit lines 160 and the spacer structure 170, and which may include a material like silicon nitride. The spacer layer 175 preferably includes a material being the same as that of the spacer 171, being different from that of the spacer 173, and having different etching selectivity related to that of the spacer 173, but not limited thereto.

Following these, a plurality of plug trenches (not shown in the drawings) is defined between each bit line 160, and the plugs are then formed in each plug trench. In the present embodiment, after forming the spacer layer 175, a deposition process and a planarization process such as a chemicalmechanical polishing (CMP) may be optionally performed, to form an interlayer dielectric (ILD, not shown in the drawings) layer on the substrate 100 to at least fill up the spaces between each bit lines 160 and to obtain a planar top surface. The ILD layer for example includes a material having an etching selectivity related to that of the spacer layer 175, such as silicon oxide or silicon oxynitride. After that, a self-aligned double patterning lithography (SADP) is performed by using the etching selectivity between the ILD layer and the spacer layer 175, to remove the ILD layer between the bit lines 160 and the spacer layer 175 underneath, and to define the plug trenches by exposing the substrate 100 and the isolation area 101 between each bit line 160, as shown in FIG. 3. Then, a conductive layer 190, such as including SiP being formed through an epitaxial growth process, is formed in each of the plug trenches to directly contact the substrate 100 (namely the AAs 103) and/or the isolation area 101, to serve as a storage node contact (SNC) of the semiconductor memory device in the subsequent process.

The method of forming the semiconductor memory device according to the first preferred embodiment in the present invention is therefore completed. According to the method of the present embodiment, the plug trenches are directly defined by using the etching selectivity between the ILD layer and the spacer layer 175, so as to facilitate the formation of the conductive layer 190 and the storage node in the subsequent processes. Thus, the method of the present embodiment enables to form the semiconductor memory device in a simplified process flow. However, the positions of the plug trenches and the AAs 103 of the substrate 100 in the present semiconductor memory device are not perfectly in alignment with each other, as shown in FIG. 4, so that, if the AAs 103 of the substrate 100 is not exposed enough in some situations due to the displacement of the plug trenches or the unetched spacer layer 175, the formation of the conductive layer 190 will be seriously affected. That is, the semiconductor memory device formed thereby may easily have defects like disconnection of the storage node contact.

Thus, people skilled in the arts may fully understand that the forming method of the present invention is not limited to be achieved through the aforementioned process, and may also include other process. The following description will detail the different embodiments of the forming method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Referring to FIGS. 5-10, FIGS. 5-10 illustrate a forming method of semiconductor device according to a second preferred embodiment of the present invention. The formal steps in the present embodiment are similar to those in the first embodiment, for example including the steps of forming the substrate 100, the BWLs 140 and the bit lines 160, and which will not redundantly described herein. The differences between the present embodiment and the aforementioned first embodiment are mainly in the formations of the spacer structure 270 and the dielectric layer 230a.

Figure 5:
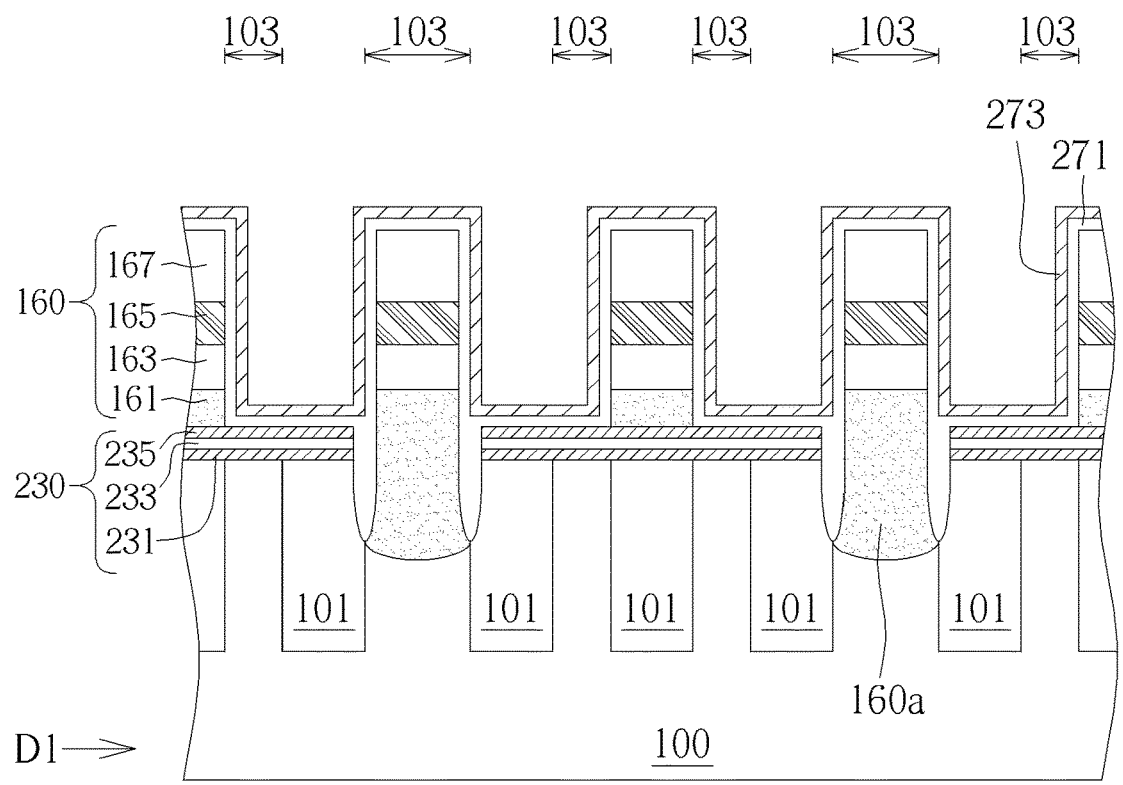

Precisely speaking, the dielectric material layer 230 of the present embodiment is also formed after defining the openings of the bit line contacts 160a, and which may also include a multilayer structure, for example including an oxide layer 231-a nitride layer 233-an oxide layer 235 (ONO) structure, but not limited thereto. Furthermore, the bit lines 160 of the present embodiment are formed by using a top layer of the dielectric material layer 230 as shown in FIG. 5 as an etch stop layer, so that, the dielectric material layer 230 may still cover the majority of the substrate 100 after the bit lines 160 are formed. Next, a silicon nitride material layer 271 and an oxide material layer 273 are sequentially formed on the substrate 100, to entirely cover the bit lines 160 and the dielectric material layer 230, with the silicon nitride material layer 271 covering both of the bit lines 160 and the bit line contacts 160a as shown in FIG. 5, and with the silicon oxide material layer 273 directly covering the silicon nitride material layer 271.

Figure 6:
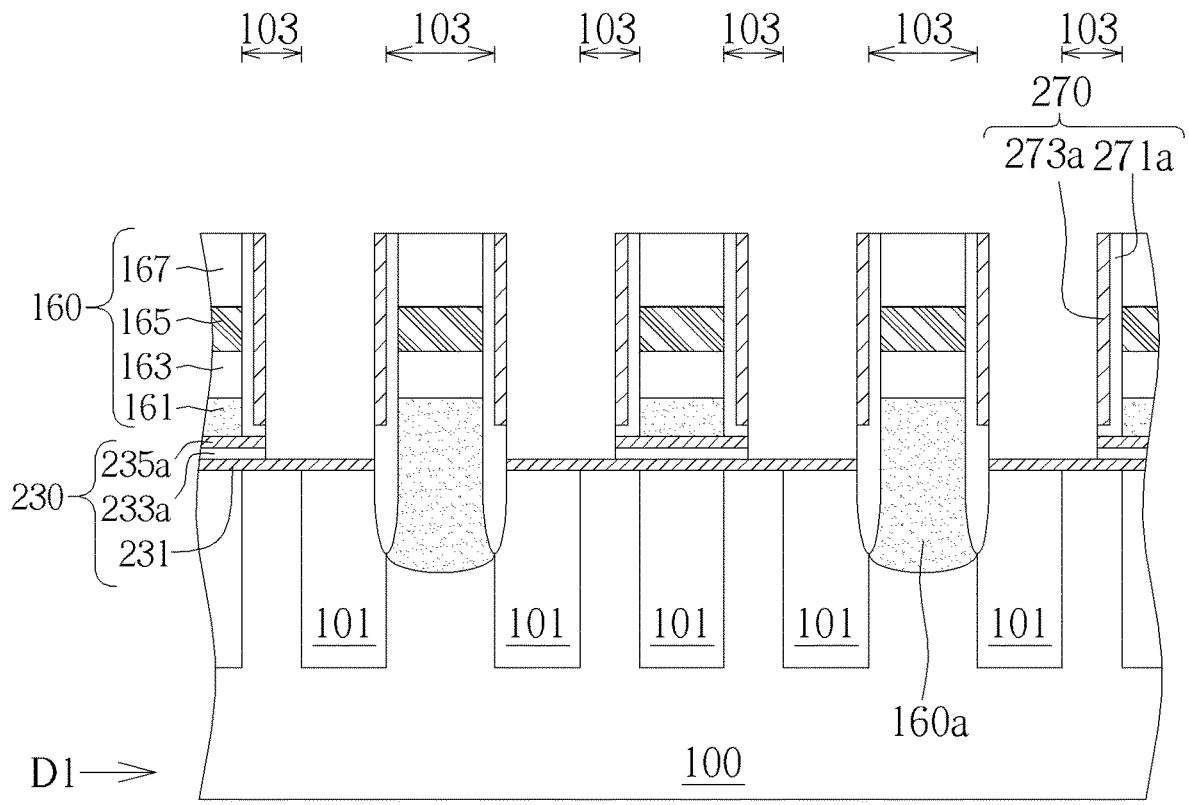

Then, an etching back process is performed, to simultaneously remove the silicon oxide material layer 273 and the silicon nitride material layer 271 covered on the top surfaces of the bit lines 160 and the substrate 100 (including the AAs 103 and/or the isolation area 101), to form two spacers 273a, 271a at two sides of each of the bit lines 160 to configured as the spacer structure 270. In the present embodiment, since the two spacers 271a, 273a are formed through the same etching process, the spacer 271a may obtain a L shape and the spacer 273a may obtain a stripe shape in a cross-sectional view along the direction D1, as shown in FIG. 6. It is noted that, according to the method of the present embodiment, the dielectric material layer 230 especially for the nitride layer 233 and the oxide layer 235 of the multi-layer structure thereof is further patterned while etching the silicon oxide material layer 273 and the silicon nitride material layer 271, by using the oxide layer 231 of the multilayer structure of the dielectric material layer 230 as an etch stop layer. Thus, the bit lines 160 and the two spacers 271a, 273a of the present embodiment, are formed on a portion (namely the nitride layer 233a and the oxide layer 235a) of the dielectric material layer 230, to obtain vertical aligned sidewalls thereby, as shown in FIG. 6. On the other hand, the other portion (namely the oxide layer 231) of the dielectric material layer 230 is remained to cover on the majority of the substrate 100, therefore being laterally protruded from the spacer structure 270 in the direction D1.

Figure 7:
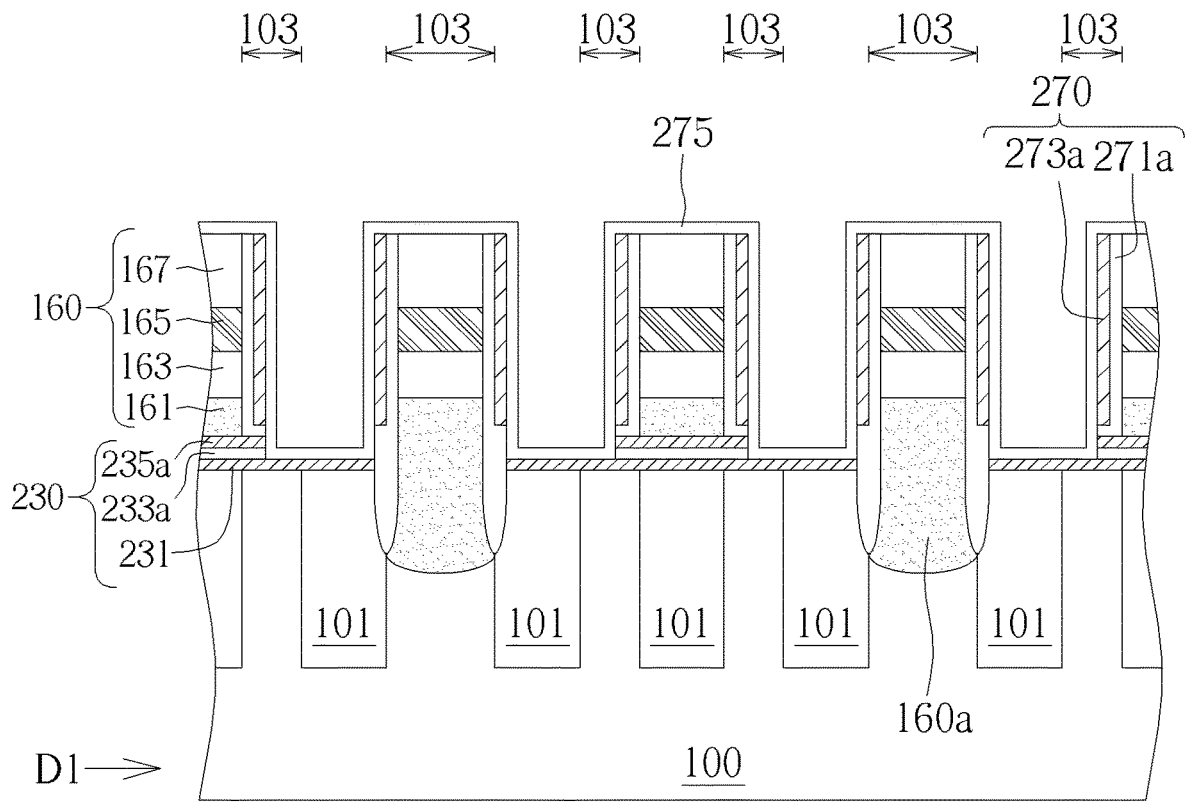
Figure 8:
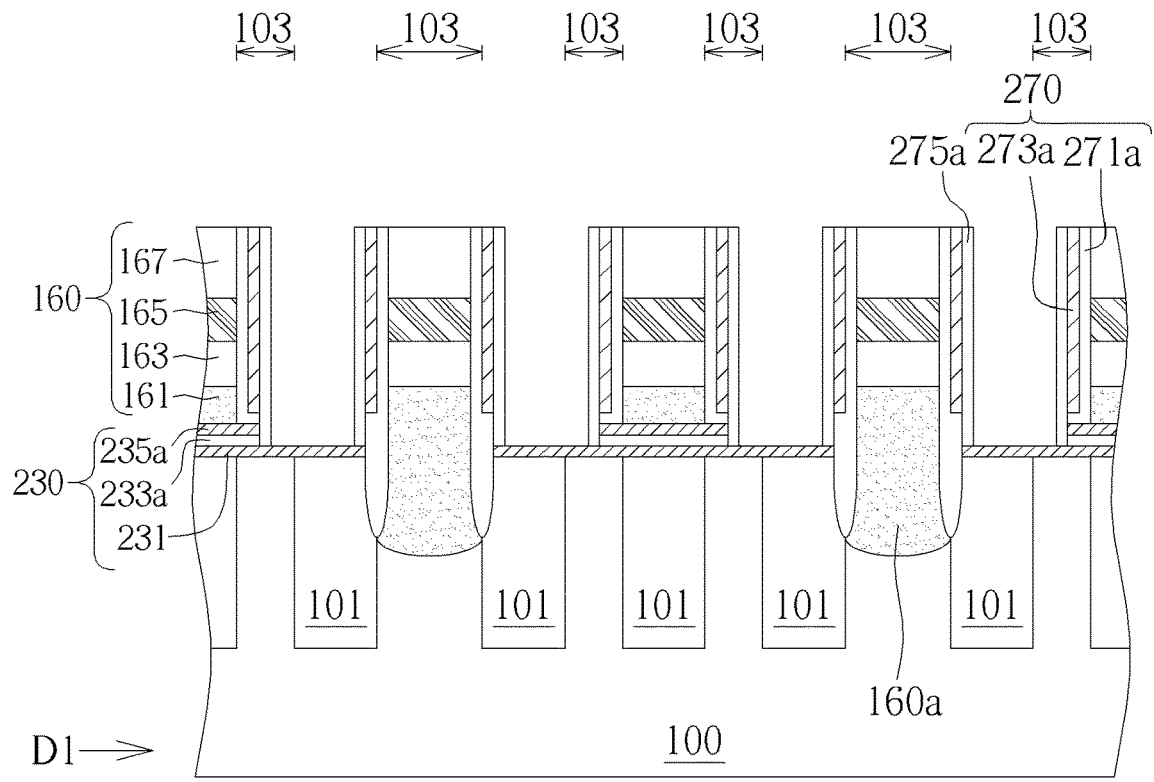

Next, a spacer layer 275a is formed on the spacer structure 170. Firstly, as shown in FIG. 7, a spacer material layer 275 is formed on the spacer structure 270, to entirely cover the substrate 100, the bit lines 160 and the spacer structure 270, and then, an etching process such as a dry etching process, is performed to remove the spacer material layer 275 covered on the top surfaces of the bit lines 160 and the substrate 100 (including the AAs 103 and the isolation area 101), to form the spacer layer 275a as shown in FIG. 8 to expose the oxide layer 231 underneath. In the present embodiment, the spacer layer 275a also includes a material (such as silicon nitride) being the same as that of the spacer 271a, being different from that of the spacer 273a, and being in different etching selectivity related to that of the spacer 273a, but not limited thereto.

Figure 9:
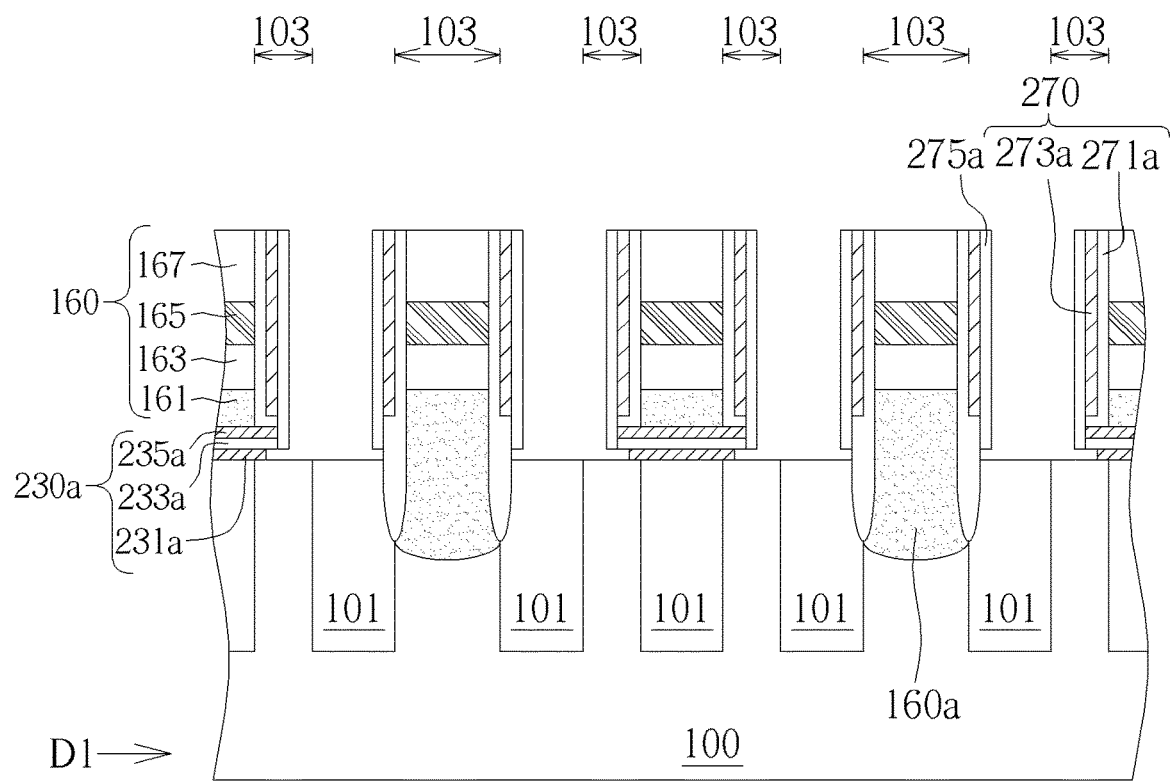
Figure 10:
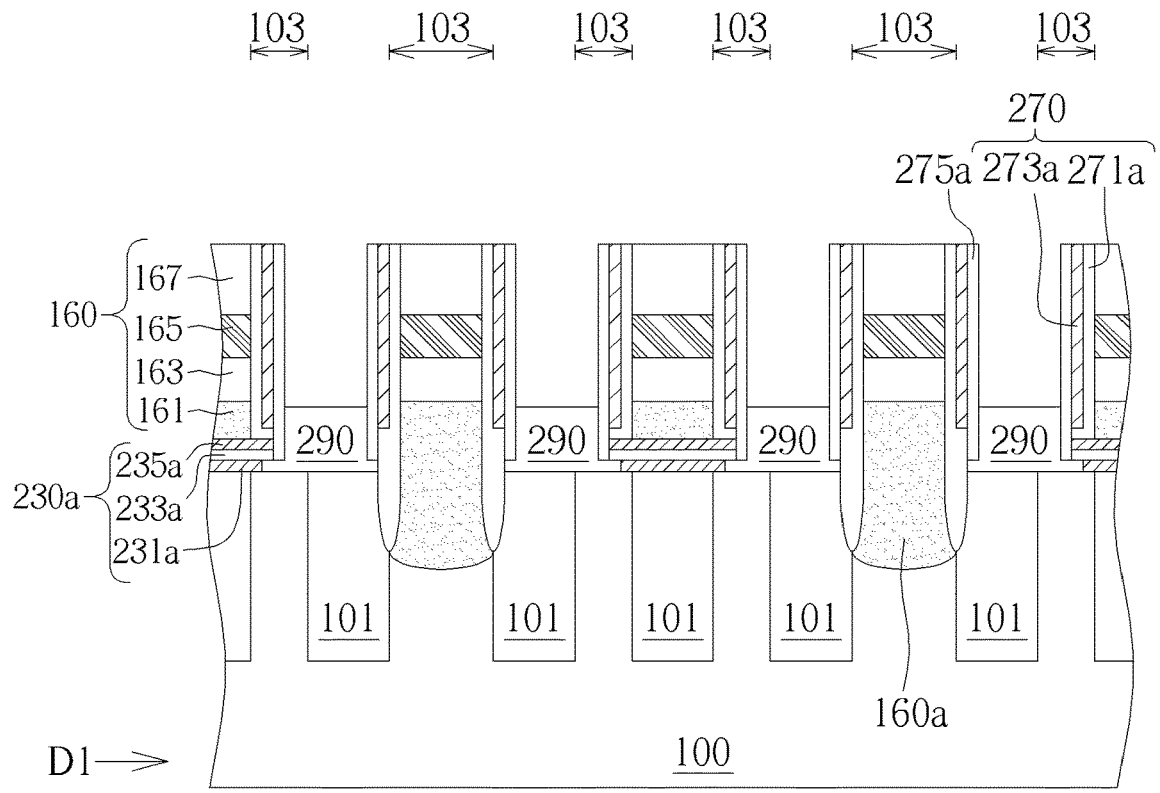

Following these, another etching process such as a wet etching process is performed, using an etchant such as dilute hydrogen fluoride (DHF) to selectivity remove the oxide layer 231 without etching the substrate 100 (namely the AAs 103) and/or the isolation area 101 underneath. In other words, the another etching process not only completely removes the exposed portion of the oxide layer 231, but also further removes the oxide layer 231 disposed under the spacer layer 275a and the spacer structure 270, to form the oxide layer 231a with an etched sidewall thereof being disposed below the spacer 271a, as shown in FIG. 9. That is, sidewalls of each layer of the dielectric layer 230a are not vertical aligned with each other, and only the oxide layer 231a disposed at the bottom layer of the multilayer structure thereof obtains a retracted sidewall. The retracted sidewall may include a vertical surface as shown in FIG. 9, or may also include a curve surface (not shown in the drawings) due to the practical etching profile, but not limited thereto. However, in other embodiment, the conditions of the another etching process may be further adjusted to make the etched sidewall of the oxide layer 231 to be disposed under the spacer 273a or under the bit lines 160, optionally. In this way, it is sufficient to expose an increased portion of the AAs 103 of the substrate 100, so that, more portions of the AAs 103 of the substrate 100 will be exposed from the plug trenches formed subsequently without affecting to the depth or the shape of the plug trenches.

Figure 11:
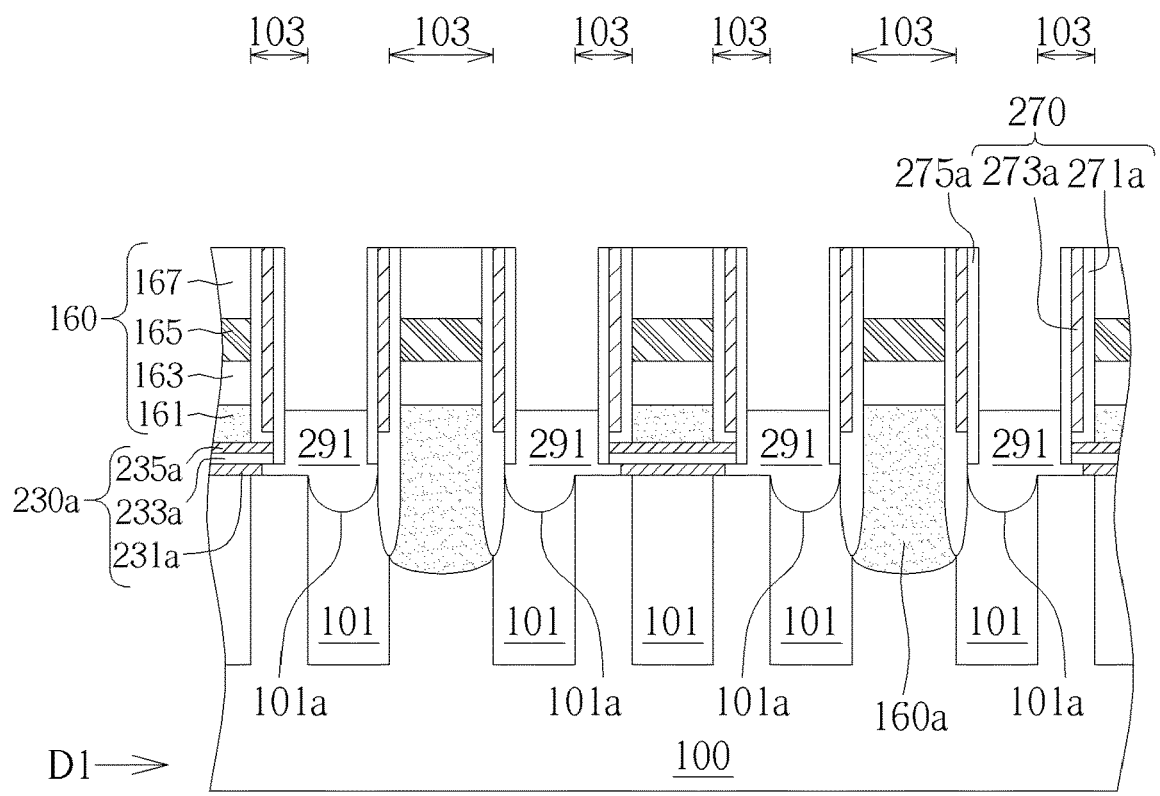
FIG. 11 is a schematic diagram illustrating a method of forming a semiconductor memory device according to another preferred embodiment of the present invention.

Then, the ILD layer at least filled up the spaces between each bit line 160 is formed, the plug trenches disposed in the ILD layer are defined, and a conductive layer 290 disposed in the plug trenches are formed in the subsequent processes as described in the aforementioned first preferred embodiment. The conductive layer 290 such as including SiP may also be formed through an epitaxial growth process, so as to serve as a storage node contact of the semiconductor memory device in the subsequent process. According to the aforementioned processes, the conductive layer 290 may also obtain a portion protruded into the position under spacer layer 275a and the spacer structure 270, for providing improved connection between the conductive layer 290 and the AAs 103 of the substrate 100. That is, the possible defects like disconnection of the storage node contact mentioned in the aforementioned embodiment may therefore be avoided. Moreover, in another embodiment while the isolation area 101 including silicon oxide, the another etching process may further etch downwardly to remove the exposed isolation area 101 under the oxide layer 231, thereby forming an opening 101a recessed in the isolation area 101 to obtain a curve surface being sunken downwardly, as shown in FIG. 11. In this way, while a conductive layer 291 of the another embodiment is formed, the conductive layer 291 may further protrude into the openings 101a of the isolation area 101, so as to both achieve the preferably connection between the conductive layer 291 and the AAs 103, and a preferable structure.

The method of forming the semiconductor memory device according to the second preferred embodiment in the present invention is therefore completed. According to the method of the present embodiment, dielectric material layer 230 is further patterned while forming the spacer structure 270, to make the nitride layer 233a and the oxide layer 235a thereof being vertically aligned with the sidewall of the spacer structure 270, and to let the oxide layer 231 thereof still covering on the substrate 100. Then, a wet etching process may be further performed in the subsequent process to selectivity remove the oxide layer 231, to form the dielectric layer 230a with sidewalls of each layer being not vertical aligned with each other. That is, it is sufficient to expose an increased portion of the AAs 103 of the substrate 100, so that, the exposed portion of the AAs 103 of the substrate 100 exposed from the plug trenches formed subsequent may also be increased thereby, without affecting to the depth or the shape of the plug trenches. Accordingly, the conductive layer 290, 291 formed at the bottom of the plug trenches may also obtain an increased contact area with the AAs 103 of the substrate 100, so as to avoid the possible defects like disconnection of the storage node contact mentioned in the aforementioned embodiment.

Overall speaking, the method of the present invention utilizes the forming process of the spacer structure to simultaneously pattern a portion of the dielectric material layer, to make partial layers of the multilayer structure of the dielectric material layer being vertical aligned with the sidewall of the spacer structure, followed by further patterned the rest bottom layer of the multilayer structure of the dielectric material layer while defining the plug trenches in the subsequent process. In this way, the dielectric layer formed thereby may obtain misaligned sidewalls in each layer, and only the oxide layer disposed at the bottom of the multilayer structure will be laterally etched to have a retracted sidewall without directly in contact with the spacer layer. That is, the semiconductor memory device obtained in the present invention may sufficiently increase the expose portion of the substrate without further affecting the depth or the shape of the plug trenches, and then, the plugs formed in those plug trenches may therefore obtain more contact areas with the substrate, so as to avoid the disconnection between the storage node contact and the transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
   providing a substrate having an isolation area to define a plurality of active areas therein;
   forming a dielectric layer on the substrate, only a bottom portion of the dielectric layer being laterally etched, wherein the forming of the dielectric layer comprises:
      forming a dielectric material layer on the substrate, to cover the isolation area and the active areas, the dielectric material layer comprising a multilayer structure; and
      patterning a portion of the multilayer structure;
   forming a plurality of bit lines on the dielectric layer, along a direction;
   forming at least one bit line contact below one of the bit lines, in the substrate;
   forming a spacer structure on sidewalls of each of the bit lines, wherein the forming of the spacer structure comprises:
      forming a first material layer covering the bit lines and the multilayer structure;
      forming a second material layer covering the first material layer; and
      patterning the second material layer and the first material layer while patterning the portion of the multilayer structure, to form the spacer structure and to leave a bottom layer of the multilayer structure being laterally protruded from the spacer structure; and
   forming a spacer layer on sidewalls of the spacer structure, the spacer layer directly in contact with the spacer structure and sidewalls of other portions of the dielectric layer.

2. The method of forming a semiconductor memory device according to claim 1, wherein the sidewalls of the spacer structure are vertically aligned with the sidewalls of other portions of the multilayer structure after patterning the portion of the multilayer structure.

3. The method of forming a semiconductor memory device according to claim 1, wherein the forming of the spacer layer comprises:
   forming a spacer material layer covering the spacer structure and the multilayer structure; and patterning the spacer material layer to expose the bottom layer of the multilayer structure.

4. The method of forming a semiconductor memory device according to claim 3, further comprising:

performing an etching process to only remove the bottom layer of the multilayer structure, to form the dielectric layer.

5. The method of forming a semiconductor memory device according to claim 4, wherein the etching process is performed after the spacer layer is formed.

6. The method of forming a semiconductor memory device according to claim 1, wherein the spacer structure comprises a first spacer and a second spacer, and the first spacer is also formed on two sides of the at least one bit line contact.

7. The method of forming a semiconductor memory device according to claim 6, wherein a sidewall of the bottom portion of the dielectric layer is disposed under the first spacer.

8. The method of forming a semiconductor memory device according to claim 1, wherein a sidewall of the bottom layer of the dielectric layer is disposed under the bit lines.

9. The method of forming a semiconductor memory device according to claim 1, wherein the dielectric layer comprises an oxide-nitride-oxide structure.

\* \* \* \* \*